US012795817B2

(12) United States Patent
Li

(10) Patent No.: US 12,795,817 B2
(45) Date of Patent: Nov. 10, 2026

(54) POWER SUPPLY CIRCUIT, PCB CIRCUIT BOARD AND POWER SUPPLY DEVICE

(71) Applicant: Black Sesame Technologies (Chongqing) Co., Ltd., Chongqing (CN)

(72) Inventor: Hai Li, Shenzhen (CN)

(73) Assignee: BLACK SESAME TECHNOLOGIES (CHONGQING) CO., LTD., Chongqing (CN)

( * ) Notice: Subject to any disclaimer, the term of this patent is extended or adjusted under 35 U.S.C. 154(b) by 295 days.

(21) Appl. No.: 18/610,958

(22) Filed: Mar. 20, 2024

(65) Prior Publication Data

US 2024/0324096 A1 Sep. 26, 2024

(30) Foreign Application Priority Data

Mar. 23, 2023 (CN) ......................... 202310294667.6

(51) Int. Cl.
*H05K 1/02* (2006.01)
*H02M 3/00* (2006.01)

(52) U.S. Cl.
CPC .......... *H05K 1/0245* (2013.01); *H02M 3/003* (2021.05); *H05K 1/0233* (2013.01)

(58) Field of Classification Search
CPC ......... H05K 1/02; H05K 1/0245; H02M 1/14; H02M 1/0025; H02H 3/08; H02H 7/12
USPC ........................................................ 174/261
See application file for complete search history.

(56) References Cited

PUBLICATIONS

Lee, EP 2 333 946 B1 (Oct. 19, 2016) (Year: 2016).*

* cited by examiner

*Primary Examiner* — Tremesha W Burns
(74) *Attorney, Agent, or Firm* — Shun Yao; Yao Legal Services, Inc.

(57) ABSTRACT

This application includes a power supply circuit, a PCB circuit board, a power supply device. The power supply circuit includes a processing circuit, a load circuit and a feedback circuit which are sequentially connected. The feedback circuit is connected to an output terminal of the load circuit and an input terminal of the processing circuit, and is configured to obtain a voltage of the output terminal of the load circuit and generate a sampling value. The processing circuit is configured to control a voltage of the output terminal of the load circuit according to the sampling value. The power supply circuit includes a differential circuit which connects the load circuit and the feedback circuit by using a differential trace manner. By means of differential trace manner, accuracy of an obtained sampling value is improved and a stability of a voltage of the output terminal of the load circuit is ensured.

10 Claims, 4 Drawing Sheets

POWER SUPPLY CIRCUIT, PCB CIRCUIT BOARD AND POWER SUPPLY DEVICE

RELATED APPLICATION

This application claims the benefit under 35 U.S.C. § 119(a) of the filing date of Chinese Patent Application No. 202310294667.6, filed in the Chinese Patent Office on Mar. 23, 2023. The disclosure of the foregoing application is herein incorporated by reference in its entirety.

TECHNICAL FIELD

The present disclosure relates to the field of power supply technologies, and in particular, to a power supply circuit, a PCB circuit board and a power supply device.

BACKGROUND

At present, a power supply circuit for supplying power to a power supply device is generally applicable to a situation that a load current of a power supply is relatively small. However, when the load current of the power supply is relatively large, voltage sampling is usually performed after a filter circuit of the power supply, so as to control a stability of a load terminal voltage of the power supply by using a sampling value. In addition, since the load current of the power supply is large, a difference between a voltage of an input terminal of the power supply and a voltage of an output terminal of the power supply is relatively great. A great voltage difference may seriously affect accuracy of the sampling value, and thus the stability of the load terminal voltage of the power supply cannot be ensured, so that a normal operation of the power supply device cannot be ensured.

SUMMARY

An objective of the present disclosure is to provide a power supply circuit, a PCB circuit board and a power supply device, which may improve accuracy of a sampling value obtained from a load circuit and improve a stability of a voltage of an output terminal of the load circuit.

To achieve the above objective, the present disclosure adopts following technical solutions:

According to a first aspect of the present disclosure, a power supply circuit is provided. The power supply circuit includes a processing circuit, a load circuit and a feedback circuit which are sequentially connected, where the feedback circuit is connected to an output terminal of the load circuit and the processing circuit, and is configured to obtain a voltage of the output terminal of the load circuit and generate a sampling value, the processing circuit is configured to control a voltage of the output terminal of the load circuit according to the sampling value generated by the feedback circuit, and the power supply circuit further includes a differential circuit, connected to the load circuit and the feedback circuit by using a differential trace.

In an exemplary embodiment of the present disclosure, the feedback circuit includes:

- a first resistor, where a first terminal of the first resistor is connected to a first node and a second terminal of the first resistor is connected to a third node;
- a second resistor, where a first terminal of the second resistor is connected a second node and a second terminal of the second resistor is connected to the third node;

- a first capacitor, where a first terminal of the first capacitor is connected to the first node and a second terminal of the first capacitor is connected to a fourth node; and
- a second capacitor, where a first terminal of the second capacitor is connected to a fifth node and the second terminal of the second capacitor is connected to a sixth node,
- where the first node is connected to the output terminal of the load circuit, the second node is connected to a ground terminal of the load circuit, the fifth node is connected to an input terminal of the processing circuit and the sixth node is connected to a ground terminal of the processing circuit.

In an exemplary embodiment of the present disclosure, the differential circuit includes:

- a third resistor, where a first terminal of the third resistor is connected to the first node and a second terminal of the third resistor is connected to a seventh node;
- a fourth resistor, where a first terminal of the fourth resistor is connected to the second node and a second terminal of the fourth resistor is connected to an eighth node; and
- a third capacitor, where a first terminal of the third capacitor is connected to the seventh node and a second terminal of the third capacitor is connected to the eighth node,
- where the seventh node is connected to the output terminal of the load circuit, and the eighth node is connected to the ground terminal of the load circuit.

In an exemplary embodiment of the present disclosure, the differential trace includes:

- a first differential wire, one terminal of the first differential wire is connected to the output terminal of the load circuit, and the other terminal of the first differential wire is connected to an input terminal of the feedback circuit; and
- a second differential wire, one terminal of the second differential wire is connected to an input terminal of the load circuit, and the other terminal of the second differential wire is connected to the input terminal of the feedback circuit.

A distance between the first differential wire and the second differential wire is equal.

In an exemplary embodiment of the present disclosure, the differential circuit includes:

- a first differential resistor, disposed on the first differential wire and close to a side of the load circuit; and
- a second differential resistor, disposed on the second differential wire and close to a side of the load circuit.

In an exemplary embodiment of the present disclosure, a polarity of the first differential wire is opposite to a polarity of the second differential wire.

In an exemplary embodiment of the present disclosure, the power supply circuit further includes a power supply output circuit and a power supply filtering circuit, the power supply output circuit is connected between the processing circuit and the power supply filtering circuit, and the power supply filtering circuit is connected between the processing circuit and the load circuit.

The power supply output circuit is configured to generate a power output voltage from a voltage output by the processing circuit, and the power supply filtering circuit is configured to filter the power output voltage.

In an exemplary embodiment of the present disclosure, the power supply circuit further includes a power supply input circuit, the power supply input circuit is connected to an input terminal of the processing circuit, and the processing circuit includes:

a switch transistor, where a terminal of the switch transistor is connected to the power supply input circuit, another terminal of the switch transistor is connected to the load circuit, and a load terminal of the switch transistor is connected to an output terminal of a control unit; and the control unit, where an input terminal of the control unit is connected to the feedback circuit, and the control unit is configured to control a voltage of the output terminal of the load circuit according to the sampling value generated by the feedback circuit.

In an exemplary embodiment of the present disclosure, the switch transistor is a Metal-Oxide-Semiconductor (MOS) transistor.

According to a second aspect of the present disclosure, a PCB circuit board is provided, which includes the above power supply circuit.

According to a third aspect of the present disclosure, a power supply device is provided, which includes the above PCB circuit board.

In the present disclosure, when a load current of a power supply is relatively large, a feedback circuit may be directly connected to an output terminal of a load circuit, and may be configured to directly obtain a voltage of the output terminal of the load circuit. Compared with the related art that sampling is performed after a power supply filtering circuit, an influence of a large voltage difference generated when the load current of the power supply is relatively large may be avoided through the technical solutions of the present disclosure, thereby improving accuracy of a sampling value obtained by the feedback circuit. After obtaining a more accurate sampling value, a processing circuit is configured to control a voltage of the output terminal of the load circuit according to the sampling value and keep the voltage stable to meet requirements of a power supply device. In addition, in the present disclosure, by providing a differential circuit and connecting the load circuit and the feedback circuit in a differential trace manner, an anti-interference capability of the feedback circuit when acquiring the sampling value may be improved, so that the accuracy of the sampling value obtained by the feedback circuit may be further improved, and a stability of the voltage of the output terminal of the load circuit may also be ensured.

BRIEF DESCRIPTION OF DRAWINGS

In order to more clearly illustrate the technical solutions in embodiments of the present disclosure or conventional technologies, the accompanying drawings configured in describing the embodiments or the conventional technologies may be introduced briefly below. Obviously, the introduced accompanying drawings are only a part of the embodiments of the present disclosure. For a person of ordinary skill in the art, other accompanying drawings may be obtained based on these accompanying drawings without creative efforts.

Figure 1:
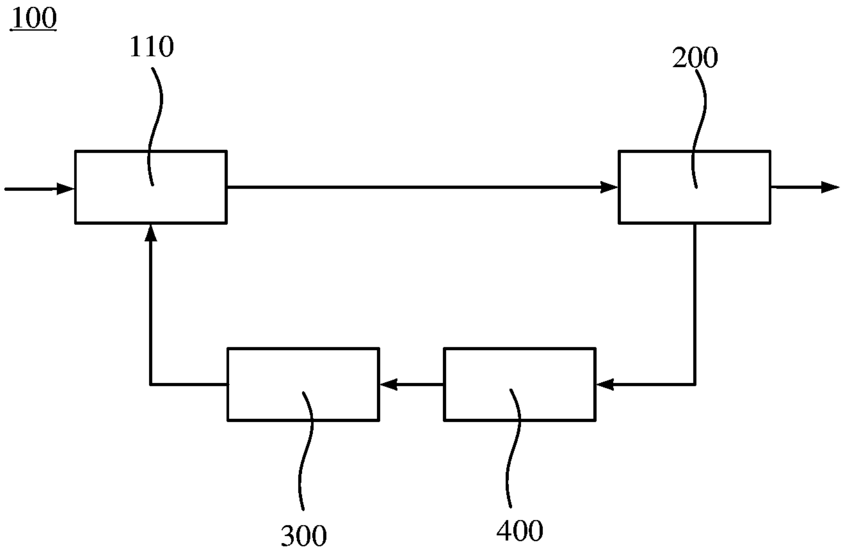
FIG. 1 is a structural block diagram of a power supply circuit according to an embodiment of the present disclosure.

The reference numerals of the primary elements in the figures are described as follows:

100, power supply circuit; 110, processing circuit; 120, switch transistor; 130, control unit; 200, load circuit; 300, feedback circuit; 310, a first resistor; 320, a second resistor; 330, a first capacitor; 340, a second capacitor; 400, differential circuit; 410, a third resistor; 420, a fourth resistor; 430, a third capacitor; 440, a first differential wire; 450, a second differential wire; 500, a power supply output circuit; 600, a power supply filtering circuit; 700, a power supply input circuit; 800, a protection circuit; 900, a detection circuit; A, a first node; B, a second node; C, a third node; D, a fourth node; E, a fifth node; F, a sixth node; G, a seventh node; H, an eighth node.

DETAILED DESCRIPTION OF THE EMBODIMENTS

Exemplary embodiments are be described more fully with reference to the accompanying drawings. However, exemplary embodiments may be implemented in various forms and should not be construed as limited to the examples set forth herein; on the contrary, providing these embodiments may make the present disclosure more comprehensive and complete, and fully convey concepts of the exemplary embodiments to the person of ordinary skill in the art. Described features, structures, or characteristics may be combined in any suitable manner in one or more embodiments. In the following description, numerous specific details are provided to provide a fully understanding of embodiments of the present disclosure.

The described features, structures, or characteristics may be combined in any suitable manner in one or more embodiments. In the following description, numerous specific details are provided to provide a fully understanding of the embodiments of the present disclosure. However, the person of ordinary skill in the art may realize that the technical solutions of the present disclosure may be practiced without one or more of the specific details, or may be employed with other methods, components, materials, etc. In other instances, well-known structures, materials or operations are not shown or described in detail to avoid obscuring the main technical creativity of the present disclosure.

When a structure is "on" other structure, it may mean that this structure is integrally formed on other structure, or this structure is "directly" disposed on other structure, or this structure is "indirectly" disposed on other structure through another structure.

The terms "one", "a" and "the" are used to indicate the presence of one or more elements/components/etc.; the terms "include" and "have" are used to indicate an open inclusive meaning and mean that additional elements/components/etc. may exist in addition to the listed elements/components/etc. The terms "first" and "second" are only used as labels, and are not intended to limit the number of objects.

At present, a power supply circuit for supplying power to a power supply device is generally applicable to a situation that a load current of a power supply is relatively small. However, when the load current of the power supply is relatively large, voltage sampling is usually performed after a filter circuit of the power supply, so as to control a stability of a load terminal voltage of the power supply by using a sampling value. In addition, since the load current of the power supply is large, a difference between a voltage of an input terminal of the power supply and a voltage of an output terminal of the power supply is relatively great. A great voltage difference may seriously affect accuracy of the sampling value, and thus the stability of the load terminal voltage of the power supply cannot be ensured, so that a normal operation of the power supply device cannot be ensured.

In an embodiment of the present disclosure, a power supply circuit is provided, and as shown in FIG. 1, the power supply circuit 100 may include a processing circuit 110, a load circuit 200 and a feedback circuit 300 which are sequentially connected. The feedback circuit 300 may be connected to an output terminal of the load circuit 200 and an input terminal of the processing circuit 110, and is configured to obtain a voltage of the output terminal of the load circuit 200 and generate a sampling value. The processing circuit 110 is configured to control a voltage of the output terminal of the load circuit 200 according to the sampling value generated by the feedback circuit 300. The power supply circuit 100 may further include a differential circuit 400, and the differential circuit 400 may be connected to the load circuit 200 and the feedback circuit 300 by using a differential trace manner.

In the present disclosure, when a load current of a power supply is relatively large, the feedback circuit 300 may be directly connected to the output terminal of the load circuit 200, and may be configured to obtain the voltage of the output terminal of the load circuit 200. Compared with the related art that sampling is performed after a power supply filtering circuit 600, an influence of a large voltage difference generated when the load current of the power supply is relatively large may be avoided through the technical solutions of the present disclosure, thereby improving accuracy of the sampling value obtained by the feedback circuit 300. After obtaining a more accurate sampling value, the processing circuit 110 is configured to control the voltage of the output terminal of the load circuit 200 according to the sampling value and keep the voltage stable to meet requirements of a power supply device. In addition, in the present disclosure, by providing the differential circuit and connecting the load circuit 200 and the feedback circuit 300 in a differential trace manner, an anti-interference capability of the feedback circuit 300 when acquiring the sampling value may be improved, so that the accuracy of the sampling value obtained by the feedback circuit 300 may be further improved, and a stability of the voltage of the output terminal of the load circuit 200 may also be ensured.

Structures of the power supply circuit 100 provided in the embodiments of the present disclosure are described in detail below:

In an embodiment of the present disclosure, a power supply circuit 100 may include a processing circuit 110, a load circuit 200 and a feedback circuit 300 which are sequentially connected. Specifically, an output terminal of the processing circuit 110 may be connected to an input terminal of the load circuit 200, an output terminal of the load circuit 200 may be connected to an input terminal of the feedback circuit 300, and an output terminal of the feedback circuit 300 may be connected to an input terminal of the processing circuit 110. The output terminal of the load circuit 200 may further be connected to a power supply terminal of the power supply device to supply power. The feedback circuit 300 is configured to generate a sampling value from the voltage of the output terminal of the load circuit 200, and the processing circuit 110 is configured to control the voltage of the output terminal of the load circuit 200 according to the sampling value generated by the feedback circuit 300 to keep the voltage stable, so as to ensure that the voltage of the power supply device is stable, thereby meeting power utilization requirements of various power supply devices.

In addition, since one terminal of the feedback circuit 300 is directly connected to the output terminal of the load circuit 200, the sampling value generated by the feedback circuit 300 is more accurate than a sampling value obtained by sampling performed after a filtering circuit in the related art. The following describes in detail, in an exemplary manner, how the feedback circuit 300 directly connected to the load circuit 200 improves the accuracy of the sampling value generated by the feedback circuit 300.

For example, in a case of a large current load, in the related art, a sampling point is generally selected after the power supply filtering circuit to obtain a sampling value, and the sampling value is used as a voltage of the output terminal of the load circuit 200. However, since the current is large at this time and there is a fixed resistance impedance between the processing circuit 110 and the load circuit 200, there is a great voltage difference between the output terminal of the processing circuit 110 and the output terminal of the load circuit 200. The voltage difference cause the sampling value obtained by sampling after the power supply filtering circuit cannot be completely and truly used as the voltage of the output terminal of the load circuit 200, thereby seriously reducing the accuracy of the sampling value, so that the processing circuit 110 cannot accurately control and adjust the voltage of the load circuit 200 according to the sampling value to meet requirements of a load voltage of the power supply device. However, in the present disclosure, the output terminal of the load circuit 200 is directly connected, so that the influence of the great voltage difference caused by the large current can be avoided, and the voltage of the load circuit 200 can be accurately obtained to generate a more accurate sampling value. Further, the processing circuit 110 is configured to control the voltage of the output terminal of the load circuit 200 according to the sampling value and keep the voltage stable to meet the power utilization requirement of the power supply device.

Figure 2:
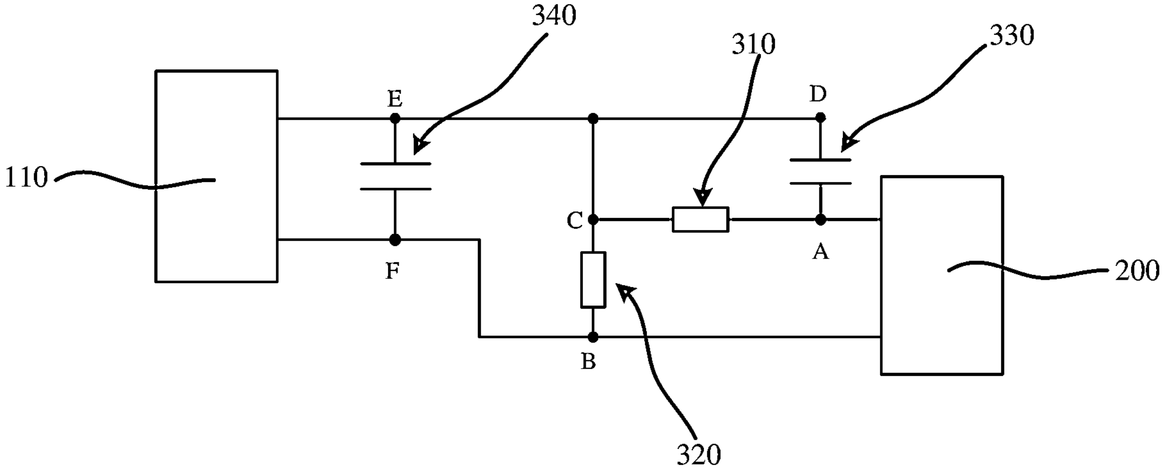
FIG. 2 is a schematic structural diagram of a feedback circuit according to an embodiment of the present disclosure.

Optionally, as shown in FIG. 2, the feedback circuit 300 may include a first resistor 310, a second resistor 320, a first capacitor 330 and a second capacitor 340. A first terminal of the first resistor 310 may be connected to a first node A and a second terminal of the first resistor 310 may be connected to a third node C. A first terminal of the second resistor 320 may be connected to a second node B and a second terminal of the second resistor 320 may be connected to the third node C. A first terminal of the first capacitor 330 may be connected to a first node A and a second terminal of the first capacitor 330 may be connected to a fourth node D. A first terminal of the second capacitor 340 may be connected to a fifth node E and a second terminal of the second capacitor 340 may be connected to a sixth node F. The first node A is connected to the output terminal of the load circuit 200, and the second node B is connected to a ground terminal of the load circuit 200. The fifth node E is connected to the input terminal of the processing circuit 110, and the sixth node F is connected to a ground terminal of the processing circuit 110.

It should be noted that the first resistor 310 and the second resistor 320 can be used as sampling resistors. A sampling value of the load circuit 200 is obtained by detecting a resistance of the first resistor 310 and a resistance of the second resistor 320.

In an embodiment of the present disclosure, the power supply circuit 100 may further include a differential circuit 400, and the differential circuit 400 may be connected to the load circuit 200 and the feedback circuit 300 in a differential trace manner. When there are various possible signal noise interferences in the power supply circuit 100, since the above signal noise interferences can be coupled to a differential trace at the same time, the signal common-mode noise may be completely offset, so that an anti-interference capability of the differential trace may be greatly improved, and the anti-interference capability of the feedback circuit 300 when acquiring the sampling value may be improved, thereby further improving the accuracy of the sampling value obtained by the feedback circuit 300 and also ensuring the stability of the voltage of the output terminal of the load circuit 200.

Figure 3:
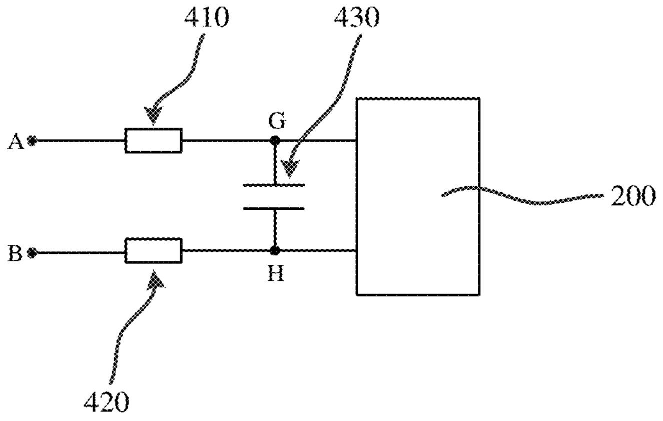
FIG. 3 is a schematic structural diagram of a differential circuit according to an embodiment of the present disclosure.

Optionally, as shown in FIG. 3, the differential circuit 400 may include a third resistor 410, a fourth resistor 420 and a third capacitor 430. A first terminal of the third resistor 410 is connected to the first node A and a second terminal of the third resistor 410 is connected to a seventh node G. A first terminal of the fourth resistor 420 is connected to the second node B and a second terminal of the fourth resistor 420 is connected to an eighth node H. A first terminal of the third capacitor 430 is connected to the seventh node G and a second terminal of the third capacitor 430 is connected to the eighth node H. The seventh node G is connected to the output terminal of the load circuit 200 and the eighth node H is connected to the ground terminal of the load circuit 200.

It should be noted that the third resistor 410 and the fourth resistor 420 can be used as differential resistors, and the differential resistors can be respectively connected to the output terminal of the load circuit 200 and the input terminal of the feedback circuit 300 by a differential trace. Specifically, differential resistors can be connected to the load circuit 200 and the feedback circuit 300 by the differential trace, and the differential trace can reduce the interference when the feedback circuit 300 obtains the sampling value, so as to improve the accuracy of the sampling value.

Figure 4:
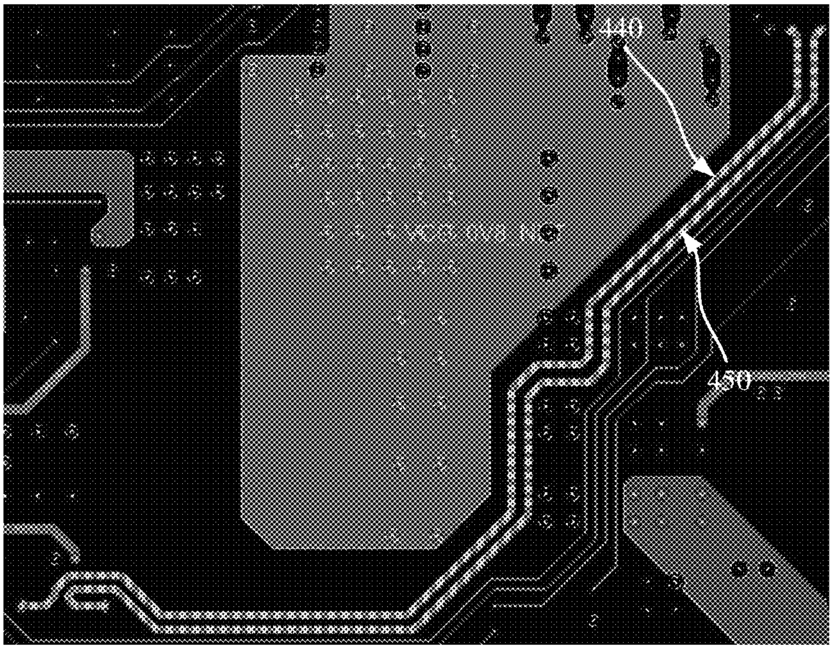
FIG. 4 is a structural diagram of a differential trace according to an embodiment of the present disclosure.

Optionally, as shown in FIG. 4, the differential trace may include a first differential wire 440 and a second differential wire 450, one terminal of the first differential wire 440 is connected to the output terminal of the load circuit 200 and the other terminal of the first differential wire 440 is connected to the input terminal of the feedback circuit 300; and one terminal of the second differential wire 450 is connected to an output terminal of the load circuit 200 and the other terminal of the second differential wire 450 is connected to the input terminal of the feedback circuit 300. A distance between the first differential wire 440 and the second differential wire 450 is equal. Specifically, two terminals of the first differential wire 440 are respectively connected to the output terminal of the load circuit 200 and an input terminal of the feedback circuit 300; two terminals of the second differential wire 450 are respectively connected to the output terminal of the load circuit 200 and an input terminal of the feedback circuit 300; and the first differential wire 440 and the second differential wire 450 are coupled to each other to form the differential trace. When common-mode noise exists outside, since the first differential wire 440 and the second differential wire 450 are coupled to each other, the common-mode noise can be coupled to the first differential wire 440 and the second differential wire 450 at the same time, so that the common-mode noise may be completely offset.

Optionally, the differential trace can send a differential signal to the feedback circuit 300, and the differential signal may include a first differential signal and a second differential signal. The first differential signal and the second differential signal are equal in amplitude and opposite in phase. In the present disclosure, a difference between the first differential signal and the second differential signal is used as a differential signal, since the difference is zero when the common-mode noise is coupled to the first differential signal and the second differential signal, the common-mode noise cannot interfere with the first differential signal and the second differential signal. That is, the anti-interference performance of the first differential signal and the second differential signal may be improved by using the first differential wire 440 and the second differential wire 450 coupled to each other, further improving the accuracy of a sampling value obtained by the feedback circuit 300, so that a voltage output by the load circuit 200 may meet the power utilization requirement of the power supply device.

Furthermore, a distance between the first differential wire 440 and the second differential wire 450 is equal. Specifically, in the present disclosure, the distance between the first differential wire 440 and the second differential wire 450 is equal, which may ensure a differential impedance of the first differential wire 440 is consistent with a differential impedance of the second differential wire 450, so as to reduce a radiation and reflection of the differential signal, further improving the anti-interference performance of the differential signal.

Furthermore, a length of the first differential wire 440 is the same as a length of the second differential wire 450. Specifically, by making the length of the first differential wire 440 and the length of the second differential wire 450 the same, the first differential signal and the second differential signal maintain opposite polarity at all times, thereby reducing a common-mode component and improving the anti-interference performance of the differential signal.

Furthermore, a polarity of the first differential wire 440 is opposite to a polarity of the second differential wire 450. Specifically, since the polarity of the first differential wire 440 is opposite to the polarity of the second differential wire 450, electromagnetic fields radiated from the first differential wire 440 and the second differential wire 450 may be offset with each other. When the first differential wire 440 is coupled to the second differential wire 450 more closely, the less electromagnetic energy is discharged to outside, which may not interfere with other wires.

Furthermore, a switch change of the differential signal is located at an intersection of the first differential signal and the second differential signal. Compare with an existing common single-ended signal that is judged depend on high and low threshold voltages, the differential trace in the present disclosure is less affected by the process and the temperature, and errors in the timing sequence may be reduced, thereby improving the accuracy of timing positioning of the differential trace. In addition, improving the accuracy of timing positioning of the differential trace may also improve the accuracy of the sampling value, so that the processing circuit 110 may accurately control the voltage of the load circuit 200 to meet the power utilization requirement of the power supply device.

Of course, the differential trace may further include a differential trace formed by other differential traces, for example, the differential trace may include a first differential wire 440 and a second differential wire 450 composed of a pair; and the differential trace may further include first differential wires 440 and second differential wires 450 composed of two or more pairs, which are not specifically limited in the present disclosure. A person skilled in the art can design corresponding differential traces according to different actual situations, which also fall into the content of the present disclosure.

Optionally, a third resistor 410 may be disposed on the first differential wire 440 and close to a side of the load circuit 200; and a fourth resistor may be disposed on the second differential wire 450 and close to the side of the load circuit 200. Specifically, the third resistor 410 and the fourth resistor 420 are both arranged close to the load circuit 200, so as to ensure that the differential trace can be successfully set, that is, a premise of realizing the differential trace is to dispose the third resistor 410 and the fourth resistor 420. Of course, the number of the third resistor 410 and the fourth resistor 420 may be multiple, which are not specifically limited in the present disclosure, and a person skilled in the art can design different numbers of the third resistors 410 and the fourth resistors 420 according to actual requirements.

Optionally, the third resistor 410 is 0 ohm resistor with a resistance accuracy of 1%; the fourth resistor 420 is a 0 ohm resistor with a resistance precision of 1%, and thus the accuracy of forming the differential trace may be ensured.

Figure 5:
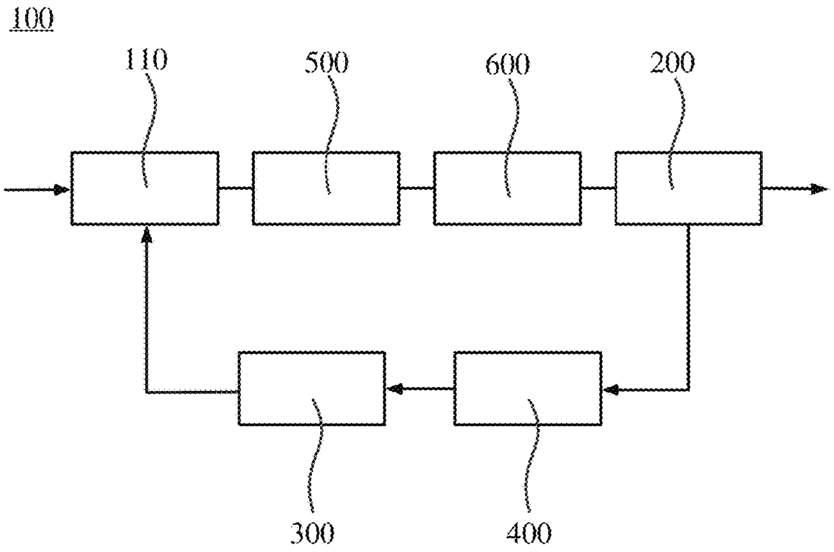
FIG. 5 is a structural block diagram of another power supply circuit according to an embodiment of the present disclosure.

In an embodiment of the present disclosure, as shown in FIG. 5, the power supply circuit 100 may further include a power supply output circuit 500 and a power supply filtering circuit 600, the power supply output circuit 500 is connected between the processing circuit 110 and the power supply filtering circuit 600, and the power supply filtering circuit 600 is connected between the processing circuit 110 and the load circuit 200. The power supply output circuit 500 is configured to generate a power output voltage from a voltage output by the processing circuit 110, and the power supply filtering circuit 600 is configured to filter the power output voltage. The power supply output circuit 500 can receive the voltage output by the processing circuit 110 and generate a power output voltage, and the power output voltage is a one-way pulsating voltage and cannot be directly used for the power supply device. Therefore, the power output voltage needs to be filtered by the power supply filtering circuit 600 to eliminate an alternating current component in the power output voltage before it can be transmitted to supply power to the power supply device. It should be noted that the power supply filtering circuit 600 is further configured to perform low-frequency filtering and high-frequency filtering on the power output voltage.

Optionally, the power supply filtering circuit 600 may include one of or a combination of a capacitor filtering circuit, an N-type RC filtering circuit, an N-type LC filtering circuit and an electronic filter circuit. This is not specifically limited in the present disclosure, and the capacitor filtering circuit is described in detail below in an exemplary manner.

For example, when the power supply filtering circuit 600 in the present disclosure is the capacitor filtering circuit and the power supply output circuit 500 outputs a voltage, the voltage is a one-way pulsating direct current voltage waveform. The direct current voltage waveform changes periodically, and the one-way pulsating direct current voltage may be decomposed into two parts: AC (Alternating Current) and DC (Direct Current). In a capacitor filtering circuit, the alternating current component in the voltage may be filtered by disposing a capacitor and using characteristics of the capacitor such as “isolation DC but through AC” and energy storage, or by using characteristics of an inductor such as “isolation AC but through DC”. In this way, the filtering of the power output voltage may be completed, so as to supply power to the power supply device. It should be noted that, when a capacity of the capacitor is larger, a capacitive reactance to the AC component is smaller, and thus a filtering effect is better. The capacity of the capacitor is not specifically limited in the present disclosure, and a person skilled in the art can dispose capacitors of different capacities according to different power supply circuits 100 to meet the requirements of the power supply circuits 100.

Figure 6:
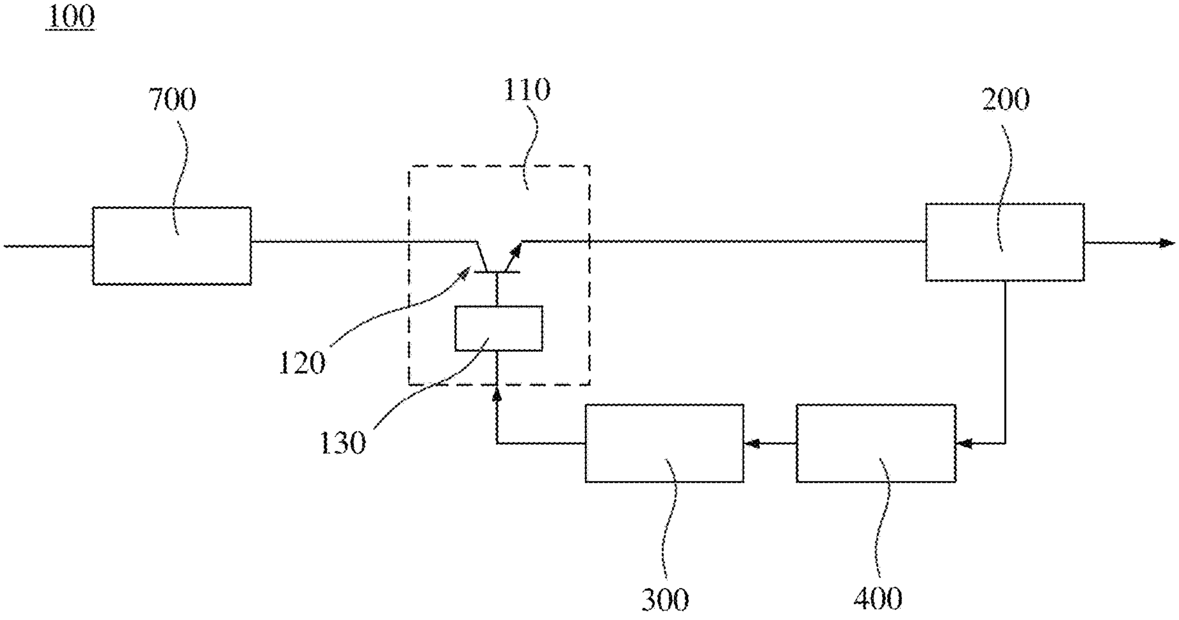
FIG. 6 is a structural block diagram of another power supply circuit according to an embodiment of the present disclosure.

In an embodiment of the present disclosure, as shown in FIG. 6, the power supply circuit 100 may further include a power supply input circuit 700. The power supply input circuit 700 is connected to an input terminal of the processing circuit 110, and the processing circuit 110 includes a switch transistor 120 and a control unit 130. A terminal of the switch transistor 120 is connected to the power supply input circuit 700 and another terminal of the switch transistor 120 is connected to the load circuit 200, and a load terminal of the switch transistor 120 is connected to an output terminal of the control unit 130. An input terminal of the control unit 130 is connected to the feedback circuit 300, and the control unit 130 is configured to control the on or off of the switch transistor 120 according to a sampling value generated by the feedback circuit 300 to adjust the voltage of the output terminal of the load circuit 200. Specifically, the switch transistor 120 is in an “on” state or “off” state. Therefore, by using this characteristic of the switch transistor 120, the control unit 130 may send a control signal to the switch transistor 120, and the switch transistor 120 responds to the control signal to make a periodic “on” or “off” change, so that the switch transistor 120 may perform pulse modulation on the power supply input by the processing circuit 110, and thus the output voltage of the processing circuit 110 may be adjusted automatically, and the output voltage of the processing circuit 110 may be kept stable to meet the power utilization requirement of the power supply device.

Optionally, the switch transistor 120 may be a Metal-Oxide-Semiconductor Field-Effect (MOS) transistor. Metal-Oxide-Semiconductor Field-Effect Transistor (MOSFET) is a field-effect transistor that can be widely used in analog circuits and digital circuits. MOSFET can be divided into two types of “N-type” and “P-type” according to different polarities of “channels” (working carriers) of the MOSFET, which are generally referred to as an NMOSFET and a PMOSFET, and other abbreviations include NMOS, PMOS, etc. Such as Bipolar Junction Transistors (BJT) or Field Effect Transistors (FET), when a transistor is a bipolar junction transistor, its control electrode refers to a gate of the bipolar junction transistor, a first electrode may be a collector or an emitter of the bipolar junction transistor, a corresponding second electrode may be the emitter or the collector of the bipolar junction transistor, and in a practical application, “emitter” and “collector” can be interchanged according to a signal flow direction. When a transistor is a field effect transistor, its control electrode refers to a gate of the field effect transistor, a first electrode may be a drain or a source of the field effect transistor, a corresponding second electrode may be a source or a drain of the field effect transistor, and in a practical application, "source" and "drain" can be interchanged according to a signal flow direction.

It should be noted that, in the present disclosure, the MOS transistor is used as the switch transistor 120, due to a noise coefficient of the MOS transistor is small, an interference degree to other signals is low. In addition, a switching speed of the MOS transistor is fast, that is, the speed of the MOS transistor is relatively fast in switching a state of "on" or "off", so that the MOS transistor can quickly respond to a control signal of the processing circuit 110, and the voltage of the load circuit 200 may be quickly adjusted and may be quickly kept stable, thereby quickly meeting the power utilization requirement of the power supply device.

Optionally, the processing circuit 110 may further include a PWM circuit, the PWM circuit may output PWM control signals with different duty ratios, and an input terminal of the processing circuit 110 is configured to generate a feedback voltage according to the output voltage of the load circuit 200 and PWM control signals with different duty ratios, so that the output voltage may be adjusted according to the feedback voltage and an input voltage, thereby achieving load voltage adjustment.

Figure 7:
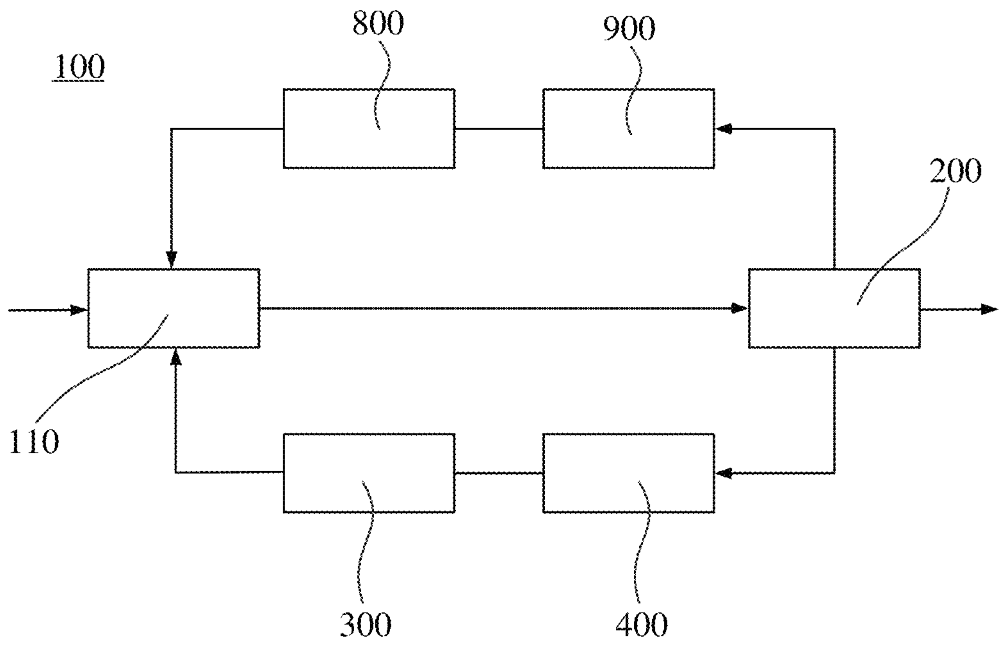
FIG. 7 is a structural block diagram of another power supply circuit according to an embodiment of the present disclosure.

In an embodiment of the present disclosure, as shown in FIG. 7, the power supply circuit 100 may further include a detection circuit 900 and a protection circuit 800. An input terminal of the detection circuit 900 is connected to an output terminal of the load circuit 200, which is configured to output a fault signal when it is detected that the power supply device is in a wave-by-wave current limiting protection mode. An input terminal of the protection circuit 800 is connected to an output terminal of the detection circuit 900 and an output terminal of the protection circuit 800 is connected to a processing circuit 110, and the protection circuit 800 is configured to output a preset control signal to the processing circuit 110 after receiving the fault signal, so that the processing circuit 110 controls a power conversion circuit of the power supply device to be turned off. The detection circuit 900 includes a voltage detection circuit, a current detection circuit and a fault signal generation circuit. An input terminal of the voltage detection circuit and an input terminal of the current detection circuit are used as input terminals of the detection circuit 900, which are respectively connected to the output terminal of the load circuit 200. An output terminal of the voltage detection circuit is connected to a first input terminal of the fault signal generation circuit and an output terminal of the current detection circuit is connected to a second input terminal of the fault signal generation circuit. An output terminal of the fault signal generation circuit is used as the output terminal of the detection circuit and is connected to the input terminal of the protection circuit 800. The voltage detection circuit is configured to detect an output voltage of the power supply, and output a preset voltage detection signal when the output voltage is less than a preset voltage threshold. The current detection circuit is configured to detect an output current of the power supply, and output a preset current detection signal when the output current is greater than a preset current threshold. The fault signal generation circuit is configured to output a fault signal when the preset voltage detection signal and the preset current detection signal are received at the same time. The above protection circuit 800 may control the power supply device to shut down and stop output power after the power supply enters a wave-by-wave current limiting protection mode, so as to avoid a cable connected to an output terminal of the power supply device from being in a low-voltage constant-current working state for a long time, thereby avoiding potential safety hazards caused by high temperature of the cable.

Furthermore, if an output-side short-circuit fault still exists after the power supply device is restarted, the power supply device may enter the wave-by-wave current limiting protection mode again, also trigger the protection circuit 800 provided by the present disclosure again, so that the power supply device is shut down again, and the cycle is repeated until the output-side short-circuit fault is eliminated, thereby effectively improving operation safety of the power supply device.

Optionally, the voltage detection circuit may include one of an isolated voltage detection circuit and a non-isolated voltage detection circuit; and the current detection circuit may include one of an isolated current detection circuit and a non-isolated current detection circuit.

An embodiment of the present disclosure further provides a PCB circuit board, which may include the power supply circuit 100 described above. It can be understood that when a load current of the power supply is relatively low and a copper-coated trace is laid on the PCB circuit board, a resistance impedance of the PCB circuit board is relatively small and can be substantially ignored. However, when the load current of the power supply is relatively large, a power supply trace requirement on the printed PCB circuit board may be high. A basic requirement is that a large area copper-coated trace is required, but because the load current is large and may exceed 10 amps or higher, in this case, even if a large area copper-coated trace is laid, there may be a resistance impedance. For example, a power supply trace voltage of the circuit board PCB, a power supply trace resistance of the circuit board PCB and the load current of the power supply are determined by the following formula:

$$V_t = R_t \times I_{out};$$

$V_t$ is the power supply trace voltage of the circuit board PCB, $R_t$ is the power supply trace resistance of the circuit board PCB and $I_{out}$ is the load current of the power supply.

Therefore, a relationship between a load voltage of the power supply $V_r$ and the power output voltage $V_{out}$ is determined by the following formula:

$$V_r = V_{out} - V_t;$$

It can be seen from the above that when $I_{out}$ is relatively small, $V_t$ is approximately equal to zero, that is, $V_r = V_{out}$; and when $I_{out}$ is relatively large, $V_t$ cannot be equal to zero, there may be a voltage difference between an output terminal of the power supply and a load terminal of the power supply, thereby resulting in inconsistent between a voltage of the output terminal of the power supply and a voltage of the load terminal of the power supply. The higher the current and the greater the voltage difference, which makes the voltage of the load terminal of the power supply is unstable, resulting in possible failure of a load terminal circuit, thereby seriously affecting power utilization of the power supply device.

Based on above problems, the present disclosure provides a PCB circuit board, which includes a power supply circuit 100. The power supply circuit 100 may include a processing circuit 110, a load circuit 200 and a feedback circuit 300 that sequentially form a closed-loop connection. The feedback circuit 300 is connected between an output terminal of the load circuit 200 and an input terminal of the processing circuit 110, and is configured to obtain a voltage of an output terminal of the load circuit 200 and generate a sampling value. The processing circuit 110 is configured to control the voltage of the output terminal of the load circuit 200 according to the sampling value generated by the feedback circuit 300. The power supply circuit 100 may further include a differential circuit 400, and the differential circuit 400 may be connected to the load circuit 200 and the feedback circuit 300 in a differential trace manner. As shown in FIG. 4, the PCB circuit board adopts the differential trace manner, and the first differential wire 440 and the second differential wire 450 are as close as possible to the copper laying trace of the power supply, so as to reduce a sampling error of a output voltage of the load circuit 200, thereby ensuring the output voltage of the load circuit 200 is consistent with an input voltage of the feedback circuit 300.

An embodiment of the present disclosure further provides a power supply device, the power supply device includes the above PCB circuit board. The power supply device according to the embodiments of the present disclosure includes the power supply circuit 100 provided in the above embodiments of the present disclosure, a specific implementation manner of the power supply circuit 100 may refer to above embodiments, and is not described here to avoid redundancy.

According to the power supply device provided by the embodiment of the present disclosure, when the power supply device with a relatively large load current, the power supply device may also stably supply power to the power supply device to meet implementation of each function of the power supply device. In addition, the power supply circuit 100 of the power supply device has a simple structure, a relatively fast voltage adjustment processing speed and a wide applicability.

Each embodiment of the present disclosure is described in a progressive manner, and each embodiment focuses on differences from other embodiments, the same or similar parts between embodiments can be referred to each other. For the power supply circuit 100 disclosed in the embodiments, since it corresponds to a method disclosed in the embodiments, the description of the power supply circuit 100 is relatively simple, and relevant parts can be referred to the description of the method.

In the description of this specification, reference terms “an embodiment”, “some embodiments”, “for example”. “specific example”, or “optionally” means that specific features, structures, materials, or characteristics described in connection with the embodiment or example are included in at least one embodiment or example of the present disclosure. In the specification, schematic representations of the above terms do not necessarily refer to the same embodiment or example. Furthermore, the specific features, structures, materials or characteristics may be combined in any suitable manner in any one or more embodiments or examples. In addition, without contradicting each other, a person skilled in the art may combine and constitute different embodiments or examples described in this specification, and the features in different embodiments or examples.

It should be understood that the present disclosure does not limit its application to the detailed structure of the power supply circuit 100 proposed in the present specification. The present disclosure can have other embodiments, and can be implemented and executed in a variety of ways. The foregoing variations and modifications fall within the scope of the present disclosure. It should be understood that the present disclosure disclosed and defined in this specification extends to all alternative combinations of two or more separate features mentioned or obvious in the text and/or the drawings. All of these different combinations constitute a number of alternative aspects of the present disclosure. The embodiments of this specification illustrate preferred methods known for implementing the present disclosure and will enable the person skilled in the art to utilize the present disclosure.

What is claimed is:

1. A power supply circuit, comprising a processing circuit, a load circuit and a feedback circuit which are sequentially connected;

wherein the feedback circuit is connected to an output terminal of the load circuit and an input terminal of the processing circuit;

wherein the feedback circuit comprises a pair of sampling resistors and a pair of capacitors coupled to the sampling resistors in parallel;

wherein the feedback circuit is configured to generate a sampling value of a voltage of the output terminal of the load circuit based on voltages on the sampling resistors, wherein the processing circuit is configured to control the voltage of the output terminal of the load circuit based on the sampling value generated by the feedback circuit; and wherein the power supply circuit further comprises:

a differential circuit, connected to the load circuit and the feedback circuit by using a differential trace.

2. The power supply circuit according to claim 1, wherein the pair of sampling resistors comprises:

a first resistor, wherein a first terminal of the first resistor is connected to a first node and a second terminal of the first resistor is connected to a third node; and a second resistor, wherein a first terminal of the second resistor is connected a second node and a second terminal of the second resistor is connected to the third node; and wherein the pair of capacitors comprises:

a first capacitor, wherein a first terminal of the first capacitor is connected to the first node and a second terminal of the first capacitor is connected to a fourth node; and a second capacitor, wherein a first terminal of the second capacitor is connected to a fifth node and the second terminal of the second capacitor is connected to a sixth node; and wherein the first node is connected to the output terminal of the load circuit, the second node is connected to a ground terminal of the load circuit, the fifth node is connected to the input terminal of the processing circuit and the sixth node is connected to a ground terminal of the processing circuit.

3. The power supply circuit according to claim 2, wherein the differential circuit comprises:

a third resistor, wherein a first terminal of the third resistor is connected to the first node and a second terminal of the third resistor is connected to a seventh node;

a fourth resistor, wherein a first terminal of the fourth resistor is connected to the second node and a second terminal of the fourth resistor is connected to an eighth node; and a third capacitor, wherein a first terminal of the third capacitor is connected to the seventh node and a second terminal of the third capacitor is connected to the eighth node, wherein the seventh node is connected to the output terminal of the load circuit, and the eighth node is connected to the ground terminal of the load circuit.

4. The power supply circuit according to claim 1, wherein the differential trace comprises:

a first differential wire, one terminal of the first differential wire is connected to the output terminal of the load circuit, and the other terminal of the first differential wire is connected to an input terminal of the feedback circuit; and a second differential wire, one terminal of the second differential wire is connected to an input terminal of the load circuit, and the other terminal of the second differential wire is connected to the input terminal of the feedback circuit, wherein a distance between the first differential wire and the second differential wire is equal.

5. The power supply circuit according to claim 4, wherein a polarity of the first differential wire is opposite to a polarity of the second differential wire.

6. The power supply circuit according to claim 1, wherein the power supply circuit further comprises a power supply output circuit and a power supply filtering circuit, the power supply output circuit is connected between the processing circuit and the power supply filtering circuit, and the power supply filtering circuit is connected between the processing circuit and the load circuit;

wherein the power supply output circuit is configured to generate a power output voltage from a voltage output by the processing circuit, and the power supply filtering circuit is configured to filter the power output voltage.

7. The power supply circuit according to claim 1, wherein the power supply circuit further comprises a power supply input circuit, the power supply input circuit is connected to an input terminal of the processing circuit, and the processing circuit comprises:

a switch transistor, wherein a terminal of the switch transistor is connected to the power supply input circuit, another terminal of the switch transistor is connected to the load circuit, and a load terminal of the switch transistor is connected to an output terminal of a control unit; and the control unit, wherein an input terminal of the control unit is connected to the feedback circuit, and the control unit is configured to control a voltage of the output terminal of the load circuit according to the sampling value generated by the feedback circuit.

8. The power supply circuit according to claim 7, wherein the switch transistor is a Metal-Oxide-Semiconductor (MOS) transistor.

9. A PCB circuit board, comprising a power supply circuit;

wherein the power supply circuit comprises a processing circuit, a load circuit and a feedback circuit which are sequentially connected;

wherein the feedback circuit is connected to an output terminal of the load circuit and an input terminal the processing circuit;

wherein the feedback circuit comprises a pair of sampling resistors and a pair of capacitors coupled to the sampling resistors in parallel;

wherein the feedback circuit is configured to generate a sampling value of a voltage of the output terminal of the load circuit based on voltages on the sampling resistors;

wherein the processing circuit is configured to control the voltage of the output terminal of the load circuit based on the sampling value generated by the feedback circuit; and wherein the power supply circuit further comprises a differential circuit, connected to the load circuit and the feedback circuit by using a differential trace.

10. A power supply device, comprising a PCB circuit board;

wherein the PCB circuit board comprises a power supply circuit;

wherein the power supply circuit comprises a processing circuit, a load circuit and a feedback circuit which are sequentially connected;

wherein the feedback circuit is connected to an output terminal of the load circuit and an input terminal of the processing circuit;

wherein the feedback circuit comprises a pair of sampling resistors and a pair of capacitors coupled to the sampling resistors in parallel;

wherein the feedback circuit is configured to generate a sampling value of a voltage of the output terminal of the load circuit based on voltages on the sampling resistors;

wherein the processing circuit is configured to control the voltage of the output terminal of the load circuit based on the sampling value generated by the feedback circuit; and wherein the power supply circuit further comprises a differential circuit, connected to the load circuit and the feedback circuit by using a differential trace.

* * * * *